United States Patent
Rodriguez et al.

(10) Patent No.: US 9,982,850 B2
(45) Date of Patent: *May 29, 2018

(54) ILLUMINATION DEVICE

(71) Applicant: KONINKLIJKE PHILIPS N.V., Eindhoven (NL)

(72) Inventors: Said Rahimzadeh Kalaleh Rodriguez, Eindhoven (NL); Jaime Gomez Rivas, Eindhoven (NL); Abraham Rudolf Balkenende, Heeze (NL); Marcus Antonius Verschuuren, Berkel-Enschot (NL); Gabriel Sebastian Lozano Barbero, Eindhoven (NL); Shunsuke Murai, Kyoto (JP)

(73) Assignee: Lumileds LLC, San Jose, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/627,246

(22) Filed: Jun. 19, 2017

(65) Prior Publication Data
US 2017/0288098 A1    Oct. 5, 2017

Related U.S. Application Data

(63) Continuation of application No. 15/217,230, filed on Jul. 22, 2016, now abandoned, which is a (Continued)

(30) Foreign Application Priority Data

Jan. 18, 2011   (EP) ..................................... 11151224

(51) Int. Cl.
*H01L 33/50*   (2010.01)
*F21K 9/64*    (2016.01)
(Continued)

(52) U.S. Cl.
CPC ............ *F21K 9/64* (2016.08); *C09K 11/0883* (2013.01); *C09K 11/56* (2013.01); *C09K 11/676* (2013.01);
(Continued)

(58) Field of Classification Search
CPC ........................................................ F21V 9/08
See application file for complete search history.

(56) References Cited

U.S. PATENT DOCUMENTS 7,573,045 B2   8/2009   Gorrell et al.
7,709,811 B2   5/2010   Conner
(Continued)

FOREIGN PATENT DOCUMENTS

CN   1315484 A   10/2001
CN   101101840 A   1/2008
(Continued)

OTHER PUBLICATIONS

Chao, et al, Surface Plasmon-Enhanced Emission from Metal-Island-Coaled YAG:Ce Thin-Film Phosphor:, Electrochem. Soc., vol. 156, Issue 12, pp. J370-J374 (2009).
(Continued)

*Primary Examiner* — Daniel Petkovsek (57) ABSTRACT

Embodiments of the invention include a semiconductor light emitting device for emitting a first light at a first wavelength and a wavelength conversion medium arranged to convert at least part of the first light into a second light at a second wavelength. The wavelength conversion medium is disposed between a periodic antenna array and the semiconductor light emitting device. The periodic antenna array includes a plurality of antennas. The periodic antenna array supports surface lattice resonances arising from diffractive coupling of localized surface plasmon resonances in at least one of the antennas.

13 Claims, 7 Drawing Sheets

Related U.S. Application Data continuation of application No. 14/853,419, filed on Sep. 14, 2015, now Pat. No. 9,416,927, which is a continuation of application No. 13/995,998, filed as application No. PCT/IB2012/050190 on Jan. 16, 2012, now Pat. No. 9,157,605.

(51) Int. Cl.

| | | |
|---|---|---|
| *H01L 33/58* | (2010.01) | |
| *F21V 9/08* | (2018.01) | |
| *G02B 5/18* | (2006.01) | |
| *F21K 9/60* | (2016.01) | |
| *C09K 11/56* | (2006.01) | |
| *C09K 11/77* | (2006.01) | |
| *C09K 11/88* | (2006.01) | |
| *F21K 9/62* | (2016.01) | |
| *C09K 11/08* | (2006.01) | |
| *C09K 11/67* | (2006.01) | |
| *G02B 5/00* | (2006.01) | |
| *G03B 21/20* | (2006.01) | |
| *F21Y 101/00* | (2016.01) | |
| *F21Y 115/30* | (2016.01) | |
| *F21Y 115/10* | (2016.01) | |

(52) U.S. Cl.
CPC ...... *C09K 11/7734* (2013.01); *C09K 11/7769* (2013.01); *C09K 11/7774* (2013.01); *C09K 11/883* (2013.01); *F21K 9/60* (2016.08); *F21K 9/62* (2016.08); *F21V 9/08* (2013.01); *F21V 9/30* (2018.02); *G02B 5/008* (2013.01); *G02B 5/18* (2013.01); *H01L 33/50* (2013.01); *H01L 33/502* (2013.01); *H01L 33/58* (2013.01); *F21Y 2101/00* (2013.01); *F21Y 2115/10* (2016.08); *F21Y 2115/30* (2016.08); *G03B 21/204* (2013.01)

(56) References Cited

U.S. PATENT DOCUMENTS

| | | | |
|---|---|---|---|
| 8,081,850 | B2 | 12/2011 | Beausoleil et al. |
| 9,157,605 | B2 * | 10/2015 | Rodriguez ............ H01L 33/50 |
| 9,416,927 | B2 | 8/2016 | Rodriguez et al. |
| 9,647,182 | B2 * | 5/2017 | Verschuuren ........ H01L 33/508 |
| 2005/0053974 | A1 | 3/2005 | Lakowicz et al. |
| 2007/0058686 | A1 | 3/2007 | Capasso et al. |
| 2009/0008573 | A1 | 1/2009 | Conner |
| 2010/0103504 | A1 | 4/2010 | Lawandy |
| 2010/0126566 | A1 * | 5/2010 | Ji ............................ G02B 5/008 |
| | | | 136/252 |
| 2010/0261263 | A1 | 10/2010 | Vo-Dinh et al. |
| 2012/0091365 | A1 | 4/2012 | Moerner et al. |
| 2016/0340579 | A1 | 11/2016 | Lin et al. |

FOREIGN PATENT DOCUMENTS

| | | |
|---|---|---|
| JP | 2009038260 | 2/2009 |
| KR | 10065990 B1 | 12/2006 |
| KR | 102010013728 | 12/2010 |
| TW | 200815787 A | 4/2008 |
| TW | 200835776 A | 9/2008 |

OTHER PUBLICATIONS

First Office Action dated Aug. 28, 2015 from Chinese Application No. 201280005697.0, 16 pps.
Database WPI, XP-002646120, Thomson Scientific, Longon, GB, Dec. 13, 2006, abstract; figure 2.
Diana C. Skigin et al: "Study of resonant modes of a periodic metallic array near a dielectric interface: evanescent-to-propagating coupling viasurface plasmon excitation", Journal of Optics A Pure and Applied Optics, Institute of Physics Publishing, Bristol, GB, vol. 8, No. 3, Mar. 1, 2006, pp. 259-267.
EP11151224.0, extended European Search Report, dated Jul. 15, 2011, pp. 1-8.
V. Giannini et al: "Lighting Up Multipolar Surface Plasmon Polaritons by Collective Resonances in Arrays of Nanoantennas", Physical Review Letters, vol. 105, No. 26, Dec. 1, 2010.
Office Action dated Sep. 10, 2015 from Japanese Patent Application No. 2013-548929, pp. 1-6.
Lee et al, "Enhanced emission from BAMgAl10017:Eu2+ by localized surface plasmon resonance of silver particles", Optics Express, vol. 18, Issue 12, pp. 1214-12152(2010).
Li et al; "Plasmon-Enhanced Luminescence Useful for Wavelength Shifting in Solar Cells", Materials Science Forum, v 636, pp. 860-864 (2010).
Office Action dated May 10, 2016 from Japanese Application No. 2013-548929.
Pan et al, "Enhancement of Adsorbed Dye Monolayer Fluorescence by a Silver Nanoparticle Overlayer", J. Phys. Chem. B, 2006, 110 (35), pp. 17383-17387.
EPO as ISA, "International Search Report and Written Opinion", dated Mar. 12, 2012 from International Application No. PCT/IB2012/050190, filed Jan. 16, 2012, 13 pages.
Pompa et al: "Fluorescence enhancement in colloidal semiconductor nanocrystals by metallic nanopatterns", ScienceDirect Sensors and Actuators B, Elsevier Sequoia S.A., Lausanne, CH, vol. 126, No. 1, Sep. 20, 2007, pp. 187-192.
Sanchez-Gil Jose et al: "Survace-plasmon polariton scattering from a finite array of nanogrooves/ridges: Efficient mirrors", Applied Physics Letters, AIP, Amer. Institute of Physics, Melville, NY, vol. 86, No. 25, Jun. 16, 2005, pp. 251106-1-3.
Second Office Action dated Apr. 22, 2016 from Chinese Patent Application No. 201280005697.0.
Thomas Zentgraf et al: "Ultranarrow coupling-induced transparency bands in hybrid plasmonic systems", Physical Review B, vol. 80, No. 19, Nov. 1, 2009, pp. 195415-1/6.
Office Action dated Jan. 8, 2016 from Taiwanese Patent Application No. TW101101866, pp. 1-12.
KR Non-Final Rejection issued Mar. 14, 2018, Korean Patent Application No. 10-2013-7021669, 4 pages.

* cited by examiner

ILLUMINATION DEVICE

CROSS-REFERENCE TO RELATED APPLICATIONS

This application is a continuation of U.S. patent application Ser. No. 15/217,230, filed Jul. 22, 2016, entitled "ILLUMINATION DEVICE", which is a continuation of U.S. patent application Ser. No. 14/853,419, filed Sep. 14, 2015, issued as U.S. Pat. No. 9,416,927 on Aug. 16, 2016, which is a continuation of U.S. patent application Ser. No. 13/995,998, filed Jun. 20, 2013, issued as U.S. Pat. No. 9,157,605 on Oct. 13, 2015, which is a 371(c) national stage entry of PCT/IB2012/050190 filed on Jan. 16, 2012, which is the international application of EP 11151224.0 filed on Jan. 18, 2011. U.S. patent application Ser. No. 15/217,230, U.S. patent application Ser. No. 14/853,419, U.S. patent application Ser. No. 13/995,998, International Application No. PCT/IB2012/050190, and EP 11151224.0 are incorporated herein by reference.

FIELD OF THE INVENTION

The invention relates to an illumination device. In particular it relates to such a device applying a wavelength conversion medium. Such a device is used in, for example, illumination systems, projection systems, and laser systems.

BACKGROUND OF THE INVENTION

An embodiment of an illumination device of the kind set forth is known from U.S. Pat. No. 7,709,811. That document discloses an illumination device comprising a blue LED (e.g. GaN or InGaN) light source, an internal optical element, a wavelength converting material, and an external optical element (e.g. a plastic or glass lens). The wavelength converting material (e.g. an organic dye or inorganic phosphor) is applied to a side of the internal element facing away from the LED. The internal optical element is a rectangular or pyramid shaped prism and serves to direct primary light emitted by the LED to the wavelength converting material. Moreover, it serves to redirect secondary light emitted by the wavelength converting material in the backward direction (i.e. towards the LED) to a forward direction (i.e. away from the LED). The external optical element serves to define an application specific illumination distribution consisting of a mixture of the primary and secondary light.

Devices as disclosed by U.S. Pat. No. 7,709,811 exhibit several difficulties limiting their usefulness, such as heat management issues, efficiency issues, and emission directionality issues.

For instance, many illumination applications prescribe LED based systems providing power levels on the order of a few Watts. When concentrating light with such power levels in a relative small volume of phosphor material, the Stokes losses inherent to the wavelength conversion process result in high local heat dissipation. With a typical conductivity of 0.1-10 WK-1m-1 common to most phosphorous materials, heat transportation becomes a limiting factor at a typically applied thickness (~100 μm) of the phosphor layer necessary for realizing sufficient absorption of the exciting primary wavelength light. This results in alleviated temperature levels of the phosphor which can easily exceed 200-300° C. At such levels, the conversion efficiency of the phosphors drops significantly, potentially resulting in additional power losses and uncontrolled further heating.

Moreover, the overall efficiency of such illumination devices depends on the efficiency of the excitation and emission processes in the wavelength converting material. The excitation efficiency depends on the absorption strength of the phosphor at the primary wavelength light emitted by the LED. The emission efficiency is influenced by both the extent to which the absorbed energy (i.e. primary wavelength light) is converted into emitted energy (i.e. secondary wavelength light) and the extent to which this emitted energy is coupled out of the device in a forward direction. With respect to the absorption efficiency, many wavelength converting materials exhibit a relative low absorption coefficient (typically 10-100 cm-1 upon excitation in the 400-480 nm range). This implies that a 100-1000 μm thick layer of wavelength converting material is required for sufficient, or even complete, absorption of the excitation radiation. Such relatively large thicknesses may lead to an extended size of the light emitting area, especially when used in combination with laser light sources, and thus to a limited use of such devices as low étendue light sources in f.i. projection applications as beamers or car head lights.

Furthermore, a flat emission surface of the wavelength converting material gives rise to a Lambertian emission profile. While beam shaping optical elements are known to be useful to realize the application specific illumination distribution, these optical elements are usually bulky, need precise alignment with the LED and/or wavelength converting material, and are typically based on weakly dispersing materials (e.g. glass, plastics) which do not allow different beam shaping and beam directing of different light colors.

SUMMARY OF THE INVENTION

The invention has as an objective providing an illumination device of the kind set forth in which at least one of the problems mentioned above is alleviated. This objective is achieved with an illumination device, designed to provide an application specific illumination distribution, comprising:

(i) a light source arranged to emit light at a primary wavelength, (ii) a wavelength conversion medium arranged in light receiving relationship with the light source and designed to convert at least part of the primary wavelength light into secondary wavelength light, and (iii) a periodic antenna array disposed in close proximity to the wavelength conversion medium and arranged such that the antenna array supports surface lattice resonances arising from diffractive coupling of localized surface plasmon resonances in individual antennas for enabling the application specific illumination distribution. Advantageously, the invention provides an illumination device that allows the use of a thinner wavelength conversion medium, because the efficiency of the wavelength conversion processes (excitation and/or emission) are enhanced. Moreover, the device allows through appropriate design of the periodic antenna array to control the color, the directionality, and the polarization, as well as allows increasing the intensity, of the light emitted.

The term "close proximity" as used herein refers to a distance between the periodic antenna array and the wavelength conversion medium that is smaller than about the wavelength of the primary and/or secondary light. For typical illumination devices this distance thus should be smaller than 700 nm, preferably smaller than 300 nm, even more preferable smaller than 100 nm. Close proximity therefore also includes the situation where the antenna array is applied on a surface of the wavelength conversion medium. It also includes the situation where the antenna array is encompassed by the wavelength conversion medium.

An embodiment of the invention according to claim 2 provides the advantage of improving the wavelength conversion process through the coupling of the incident primary wavelength light or the emitted secondary light to the surface lattice resonances that arise from the diffractive coupling of localized surface plasmon polaritons in the individual antennas of the array.

According to an embodiment of the invention, the periodicity of the antenna array is of the order of the primary or secondary wavelength light. Beneficially, this allows the light to excite surface lattice resonances.

The embodiment of the illumination device according to claim 4 beneficially allows controlling the modification of the illumination distribution of the device. This modification of the emitted light distribution from Lambertian to a more confined solid angle is especially interesting for low etendue lighting applications such as projection in beamers and automotive front lighting.

The embodiment of the invention of claim 5 advantageously allows for a better coupling of the primary and/or secondary wavelength light with the antennas and surface lattice resonances of the array.

In an embodiment according to claim 6, the stretchably controllable substrate allows active control of the emission efficiency, the directionality of the emission, and the emitted wavelength of the illumination device.

In embodiments according to claims 7 to 10, the two sub-arrays allow for appropriately designing the antenna array to accommodate several optical phenomena, such as, for instance, one sub-array enhances the excitation of the wavelength conversion medium, while the other sub-array enhances the emission of and defines the direction of the secondary wavelength light.

The embodiments of claims 11 to 14 advantageously allow designing a distributed feedback light emitting device, such as a distributed feedback laser.

These and other aspects of the invention will be apparent from and elucidated with reference to the embodiments described hereinafter. Appreciate, however, that these embodiments may not be construed as limiting the scope of protection for the invention.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1:
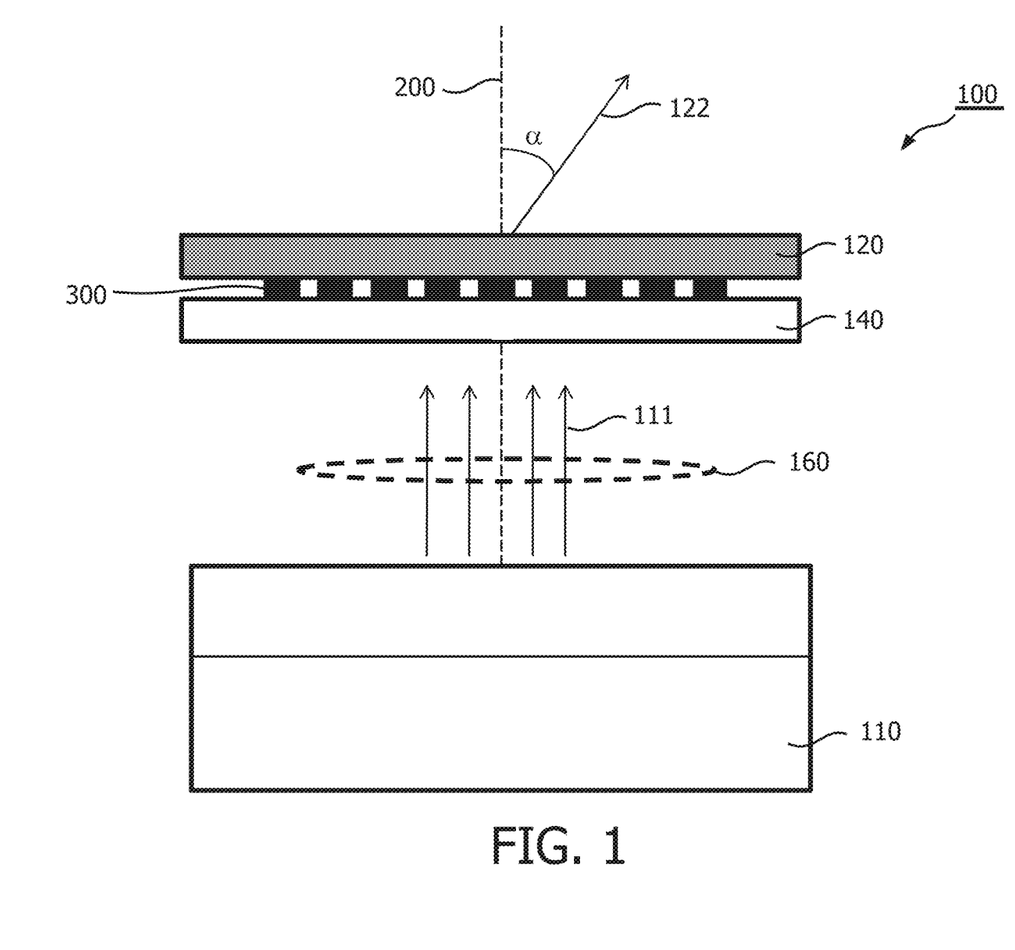
FIG. 1 schematically shows an illumination device in accordance with an embodiment of the invention.

FIG. 1 shows an illumination device 100 in accordance with the invention. The illumination device 100 comprises a light source 110, for instance a semiconductor light source such as a (inorganic or organic) light emitting diode (LED), a resonant cavity light emitting diode, a laser diode (LD), such as a vertical cavity laser diode or an edge emitting laser diode. Material systems currently of interest in the manufacture of such semiconductor light sources capable of operating in the visible spectrum include Group III-V semiconductors. In particular binary, ternary, and quaternary alloys of gallium, aluminium, indium, and nitrogen, also referred to as III-nitride materials, are of interest. Typically, III-nitride semiconductor light sources are fabricated by epitaxially growing a stack of semiconductor layers of different composition and dopant concentrations on a sapphire, silicon carbide, III-nitride, or other suitable substrate by metal-organic chemical vapour deposition, molecular beam epitaxy, or other epitaxial techniques. The stack often includes (i) one or more n-type layers doped with, for example, Si, formed over the substrate, (ii) a light emitting or active region formed over the n-type layer or layers, and (iii) one or more p-type layers doped with, for example, Mg, formed over the active region. Often III-nitride semiconductor light sources are fabricated on insulating substrates, such as sapphire, with both contacts on the same side of the device. Such light sources are mounted so light is extracted either through the contacts (known as an epitaxy-up device) or through a surface of the light source opposite the contacts (known as a flip-chip device). Light source 110 is arranged to emit a primary wavelength light 111. Depending on the alloy applied in the semiconductor light sources discussed above, the primary wavelength light ranges from the near UV (~365 nm) to the near IR (~1000 nm).

Furthermore, illumination device 100 comprises a wavelength conversion medium 120. The wavelength conversion medium may for instance comprise a phosphor, quantum dots, organic fluorescent dye molecules, etc. The primary wavelength light 111 emitted by the light source 110 is at least in part converted into secondary wavelength light 122 by the wavelength conversion medium 120. For many practical wavelength conversion media known in the art, the primary wavelength light emitted by semiconductor devices matching the excitation spectrum of these media ranges from ~400 nm to ~490 nm.

In accordance with an embodiment a wavelength conversion medium 120 comprising a phosphor is formed into a ceramic slab, referred to herein as "luminescent ceramic." Such ceramic slabs are generally self-supporting layers formed separately from the light source 110. Subsequently they are attached to the finished (semiconductor) light source or positioned in light receiving relationship to the light source. The ceramic layer may be translucent or transparent. In the latter case, scattering losses associated with non-transparent wavelength conversion media may be considerably reduced. In addition, since luminescent ceramic layers are solid, it may be easier to make optical contact with additional optical elements, such as an antenna array 300. Examples of phosphors that may be formed into luminescent ceramic layers include aluminum garnet phosphors with the general formula $(Lu_{1-x-y-a-b}Y_xGd_y)_3(Al_{1-z}Ga_z)_5O_{12}:Ce_aPr_b$ wherein 0<x<1, 0<y<1, 0<z≤0.1, 0<a≤0.2 and 0<b≤0.1, such as $Lu_3Al_5O_{12}:Ce^{3+}$ and $Y_3Al_5O_{12}:Ce^{3+}$ which emit light in the yellow-green range; and $(Sr_{1-x-y}Ba_xCa_y)_{2-z}Si_{5-a}Al_aN_{8-a}O_a:Eu_z^{2+}$ wherein 0≤a<5, 0<x≤1, 0≤y≤1, and 0<z≤1 such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_x N_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein 0<x≤1 including, for example, $CaS:Eu^{2+}$ and $SrS:Eu^{2+}$.

In accordance with an embodiment wavelength conversion medium 120 may comprise quantum dots. These quantum dots may comprise CdS, CdSe, CdTe, ZnS, or ZnSe and may optionally be overcoated with a material comprising ZnS, ZnSe, CdS, CdSe, CdTe, or MgSe. The quantum dots may be further coated with a material having an affinity for a host matrix in which they are embedded, such as a monomer related to a polymer component of the host matrix. Advantageously, such a coating enables the quantum dots to be dispersed in the host matrix without flocculation. The host matrix may be a polymer such as polystyrene, polyimide, or epoxy, a silica glass, or a silica gel.

In accordance with an embodiment wavelength conversion medium 120 may comprise organic fluorescent molecules dissolved in a host matrix. For example, BASF Lumogen dyes in host materials like Polymethylmethacrylaat (PMMA), Polycarbonate (PC), Polyethylene terephthalate (PET), Polyethylene naphthalate (PEN).

The illumination device 100, moreover, comprises a periodic antenna array 300 which is disposed in close proximity to the wavelength conversion medium 120, i.e. a distance between the periodic antenna array and the wavelength conversion medium is smaller than about the wavelength of the primary and/or secondary light. The array may be disposed on a side of the wavelength conversion medium 120 facing towards the light source 110, such as indicated in FIG. 1. Alternatively, the periodic antenna array 300 may be positioned on a side of the wavelength conversion medium facing away from the light source. The periodic antenna array 300 is formed by antennas 301 (see FIG. 2A) comprising a highly polarisable material, for instance, a metal. As an example, antennas may comprise noble metals such as gold, silver, copper, platinum, and palladium. Alternatively, they may comprise metals such as nickel, or aluminium. Alloys of the metals mentioned are also possible. Alternatively, the antennas 301 may consist of two metal layers: a thin lower one for adhesive purposes such as chromium, and a thicker upper one comprising a metal or alloy described above.

Thus, in an embodiment the periodic antenna array may be deposited on a (transparent) substrate 140, such as quartz, sapphire, or an un-doped ceramic slab using f.i. substrate conformal imprint lithography. This technique uses a stamp composed of two rubber layers on a thin glass substrate. The patterns are moulded in a stiff silicone rubber, and the thin glass plate is flexible in the out-of-plane direction. This flexibility allows for conformal contact to be made, thereby rendering accurate reproduction of nano-scale features over a very large surface area despite possible presence of defects or surface contamination. Arrays as large in size as 12 inch wafers comprising antennas with typical sizes of 250×40 $nm^2$ and with periodicities in the 200-600 nm range can be easily made with this technique. A wavelength conversion medium 120 comprising quantum dots (with or without an appropriate host matrix) may for instance be spin-coated over the antenna array 300. Alternatively, organic fluorescent molecules in an appropriate host matrix may be spin coated over the antenna array. As it is advantageous that the antennas are embedded in an optically homogeneous medium, preferably the host matrix/wavelength conversion medium has the same, or substantially similar, effective index of refraction as the substrate 140. Such a uniform optical surrounding environment allows for a better coupling of the primary and/or secondary wavelength light with the antennas and surface lattice resonances of the array, since the scattered light in the wavelength conversion medium 120 can then propagate in phase with that in the substrate 140. Substantially similar effective index of refraction at the wavelength of the surface lattice resonance in this context means that Δn is smaller than 0.5, preferably smaller than 0.3, more preferably smaller than 0.05. In general, smaller antennas 301 require a more symmetric environment. Alternatively, when the periodic antenna array 300 is deposited on an un-doped ceramic slab, this slab may be bonded to a doped ceramic slab forming the wavelength conversion medium 120. Arranging the periodic antenna array 300 sandwiched between doped and un-doped ceramic slabs comprising the same host crystal is especially advantageously, as these slabs have the same index of refraction. The space between the two slabs and the antenna array may be filled with a material (such as a fluid, polymer, or solgel) having an index of refraction matching the index of refraction of the two slabs to further enhance the optical uniformity of the array's environment.

Alternatively still, the antenna array 300 may be sandwiched between two wavelength conversion media 120. For instance, the antenna array 300 may be disposed on a first wavelength conversion medium 120, while a second wavelength conversion medium covers the antenna array. In an embodiment the first and second wavelength conversion media are formed by two doped ceramic slabs. In another embodiment, the first wavelength conversion medium is formed by a doped ceramic slab on which the antenna array is deposited, and the second comprises quantum dots spin coated over the array. In these embodiments the wavelength conversion medium 120 encompasses the antenna array 300. Optionally, the wavelength conversion medium 120 may comprise two (or more, such as three or four) materials having distinct emission spectra or colors. Such a plurality of materials may form a substantially homogeneous wavelength conversion medium. Alternatively, the materials may be physically separated, such as in the sandwiched embodiment described above.

The periodic antenna array 300 is arranged such that it supports surface lattice resonances arising from diffractive coupling of localized surface plasmon resonances in individual antennas 301. Localized surface plasmon resonances are non-propagating surface modes excited via the coupling of conducting electrons in the antennas 301 with an electromagnetic field, such as the primary wavelength light 111 and/or the secondary wavelength light 122. The electromagnetic field drives the conducting electrons to oscillate inside an antenna 301, resulting in a dipolar or multi-polar field emanating from the antenna in dependence of their form factor. Moreover, charge accumulation of the driven electrons at the surface of the antenna will lead to a depolarization field inside the antenna. The localized surface plasmon resonance takes place when the response of the electrons shows a n/2 phase lag with respect to the driving electromagnetic field. The spectral position (i.e. frequency or wavelength at which the resonance occurs) and the features of the resonance are determined by the material composition, size, geometry, and surrounding environment of the antennas 301. Moreover, they are determined by the polarization of the electromagnetic field and by inter-antenna coupling. By appropriately controlling these parameters, the primary wavelength light 111 may be resonant with the localized surface plasmon resonances, allowing an enhancement of the excitation of the wavelength conversion medium 120. Advantageously, the invention provides an illumination device 100 that allows the use of a thinner wavelength conversion medium 120, because the efficiency of the wavelength conversion process is enhanced. Moreover, the thinner wavelength conversion medium 120 functioning as a secondary light source improves the suitability of the illumination device 100 as a low etendue light emitting device, especially when using a laser (diode) as a light source 110. Furthermore, the localized surface plasmon resonances can be excited for any angle of incidence of the primary wavelength light 111 to the plane of the antenna array 300, advantageously allowing the use of a non-collimated LED.

The excitation efficiency can be further enhanced by coupling the incident primary wavelength light 111 to surface lattice resonances that arise from diffractive coupling of individual localized surface plasmon resonances. Advantageously, the primary wavelength light 111 can be collimated to optimize the coupling to surface lattice resonances. Therefore, the illumination device 100 may comprise an optional collimating optic 160, such as a lens or a compound parabolic collimator (see FIG. 1). In addition, the illumination device may comprise an optional polariser (f.i. integrated with the collimating optic 160) to control the polarization of the primary wavelength light 111 relative to the orientation of the antennas 301. Further to, or instead of, enhancing the excitation efficiency through coupling of the primary wavelength light 111 to the surface lattice resonances of the periodic antenna array 300, the secondary wavelength light 122 may couple to such lattice resonances. Due to this coupling the secondary wavelength light 122 may be emitted from the illumination device 100 within a predefined solid angle Ω at a predefined angle α relative to the optical axis 200 of the device. In contrast, absent the periodic antenna array 300 the secondary light will essentially be emitted from the wavelength conversion medium 120 with a Lambertian distribution. This modification of the emitted light distribution from Lambertian to a more confined solid angle is especially interesting for low etendue lighting applications such as projection in beamers and automotive front lighting. Thus, the application of the periodic antenna array 300 according to an embodiment of the invention effectively enhances the useful emission of the illumination device 100 in such applications by increasing the decay of the excited wavelength conversion medium 120 into lattice modes grazing to the antenna array 300 and by coupling these modes to free space radiation through scattering in the array. This enhancement may reach a factor of 10, 20, or even more than 50 within a certain wavelength-angle region compared to the Lambertian emission profile obtained without the application of the antenna array.

The two effects described above—pump enhancement and emission modification—can be combined or applied independently, depending on the geometry and dimensions of the antennas 301 and their spatial configuration in the array 300. Thus, as the strength of the coupling depends on the wavelength and the polarization, and the directionality of the emission of secondary wavelength light 122 closely resembles the angular dispersion of the surface lattice resonances, an application specific illumination distribution—including the color (hue, saturation, color point, color temperature), the direction, and the polarization—can be realized by designing the periodic antenna array 300 appropriately.

Surface lattice resonances can effectively be excited when the antennas 301 are periodically arranged in the array 300 with a lattice constant coextensive with the wavelength of the scattered (primary and/or secondary) light. The resonances result from a partial cancelation of the damping associated with the localized surface plasmon resonance of single antennas 301 by the retarded field coherently scattered by the array 300. Surface lattice resonances occur near (usually a bit red-shifted to) the energy where a diffraction order changes from radiating to evanescent in character, i.e. near a Rayleigh anomaly. The wavelength at which the Rayleigh anomaly occurs is mainly determined by the lattice constants and the refractive index of the medium surrounding the antenna array 300. For a wave vector component parallel to the plane or the array 300 given by $k_\parallel = 2\pi/\lambda \sin(\theta_{in})\hat{y}$, it is the solution to the equation $$k_{out}^2 = k_{in}^2 \sin^2(\theta_{in}) + m_1^2\left(\frac{2\pi}{a_x}\right)^2 + m_2^2\left(\frac{2\pi}{a_y}\right)^2 + 2k_{in}\sin(\theta_{in})m_2\left(\frac{2\pi}{a_y}\right).$$

Here, $(m_1, m_2)$ are integers defining the diffraction order, and $k_{out}$ and $k_{in}$ are the scattered and incident wave vectors, respectively. The angle of incidence of the light relative to the normal to the plane of the antenna array 300 is denoted by $\theta_{in}$ (assuming $\varphi_{in}=0$—see FIG. 2A), and $a_x$ and $a_y$ define the periodicities of the array in the respective directions.

Figure 2A:
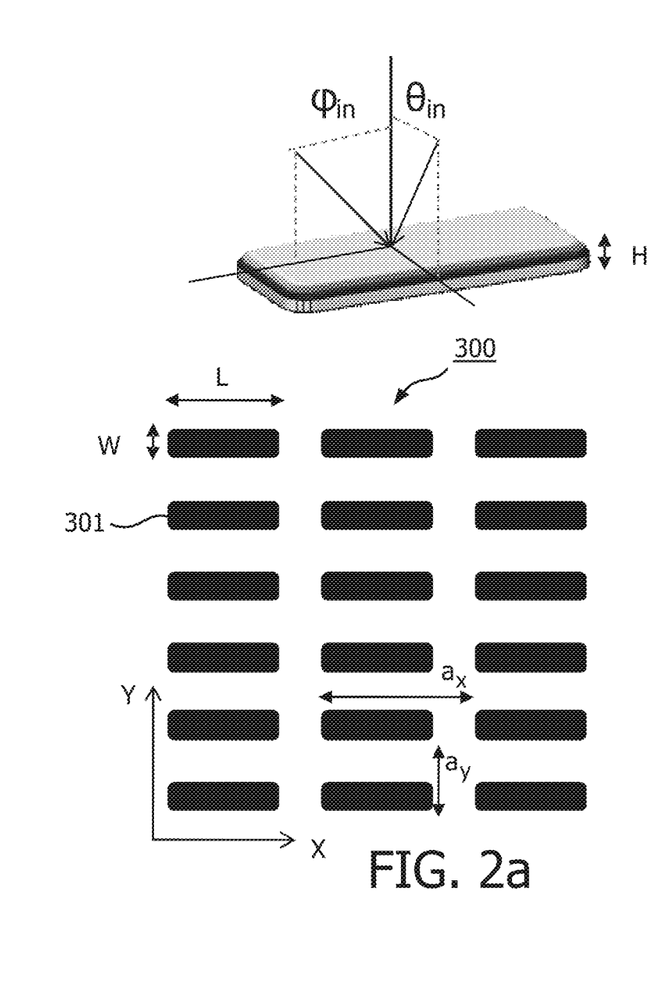
FIG. 2A shows diagrammatically a periodic antenna array.
Figure 2B:
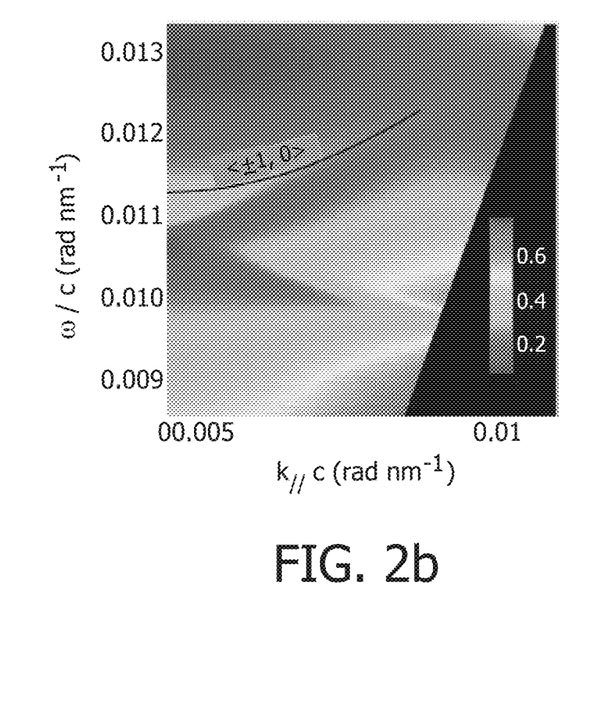
FIG. 2B shows the transmittance through the antenna array of FIG. 2A as a function of the wave vector parallel to the plane of the array and the frequency.

As indicated in FIG. 2A, the antennas 301 may have a rectangular form factor with a length L, a width W, and a height H, and positioned in a rectangular array with periodicities $a_x$ and $a_y$. L may range from 50 nm to 400 nm, W may range from 20 nm to 200 nm, and H may range from 10 nm to 70 nm. The periodicity $a_x$ of the array 300 typically ranges from 150 nm to 600 nm or ~1.5×L to ~2×L, while the periodicity $a_y$ typically ranges from 100 nm to 300 nm or ~1.5×W to ~3×W. As an example, an array 300 of antennas 301 comprising silver with dimensions L×W×H=250×70×20 nm³ configured in a rectangular lattice with constants $a_x$=350 nm and $a_y$=200 nm deposited on a quartz substrate and covered with a 200 nm thick coating of CdSe/CdS core shell quantum dots, yields a localized surface plasmon resonance for light with a polarization parallel to the short axis of the antennas at 484 nm [ω/c=2π/λ], and a surface lattice resonance near 587 nm (see FIG. 2B). The figure depicts (relative scale on the right hand side) the transmittance of light through the array/quantum dot structure. As can be observed, the localized surface plasmon resonance at around 484 nm remains nearly constant for all values of $k_\parallel$ (again: $\varphi_{in}=0$), indicating their non-propagating or localized behavior. This also indicates that this resonance can be excited by light with essentially any angle of incidence enabling enhanced absorption of the primary wavelength light 111 from a non-collimated light source 110. The diffractive coupling of the localized surface plasmon resonances leads to an optically much narrower reduction in the light transmitted around 587 nm at $k_\parallel=0$, i.e. at normal incidence. The diffractive coupling in this case takes place along the direction perpendicular to the polarization, i.e. along the x-direction. The position of the Rayleigh anomalies is indicated by the black curve.

The antennas 301 do not necessarily have to be rectangular: they may be chosen from the group consisting of circular, elliptical, and polygonal—such as triangular, square, rectangular, pentagonal, and hexagonal—shapes. Also the periodicity of the array 300 may be chosen from the group consisting of a square array, a rectangular array, a triangular array, a hexagonal array, and a quasi-crystal array. Quasi-crystals constitute a class of arrays having forbidden crystal symmetry, such as 5-fold or 10-fold symmetry. Both the shape of the individual antennas 301 and the periodicity of the array 300 influence the symmetry and direction of the light emitted by the illumination device 100. For instance, more circular shapes and a squarer periodicity result in an illumination distribution with a more symmetrical character. Alternatively, antennas with an asymmetrical shape, such as triangular or substantially triangular (pear like) shapes result in an asymmetrical illumination distribution. The later may be beneficial in lighting application requiring such an asymmetrical light distribution, such as the dipped or passing beam in automotive front lighting.

As an example, a donut or ring type illumination distribution is possible through application of two or more antenna arrays 300. For instance, two or more arrays with a rectangular lattice may be oriented such that the long axis of the antennas 301 in one array is rotated with respect to another array. Consider for example the case of two identical arrays with mirror symmetry rotated with respect to each other by 90 degrees. If the arrays sustain surface lattice resonances along one direction only and overlapping the emission of the phosphor at large angles only, the emission will be enhanced by the antennas 301 at large angles only. One array will therefore enhance the emission towards the +/−x-direction, whereas the other array will enhance the emission towards the +/−y-direction, in both cases at large angles only. By further adding arrays that are rotated with respect to each other as mentioned above, a donut shaped beam may be created. These arrays may be located in one plane, so that they essentially can be construed as interwoven sub-arrays forming a super-array. Alternatively, the arrays may be positioned in a stacked configuration, in which a first antenna array may be in close proximity to a side of the wavelength conversion medium 120 facing towards the light source 110, and a second antenna array may be in close proximity to a side facing away from the light source. In an embodiment, such a stacked configuration may comprise multiple antenna arrays and wavelength conversion media alternating each other, such as three antenna arrays and two wavelength conversion media in the configuration array1-medium1-array2-medium2-array3. Such a stacked configuration can be extended with more arrays and media, wherein each of these arrays may be comprise different antenna materials, may comprise sub-arrays, or may have different periodicities, and wherein the wavelength conversion media may all comprise a single material, may each comprise different materials, or may comprise a mixture of wavelength conversion materials.

Figure 3:
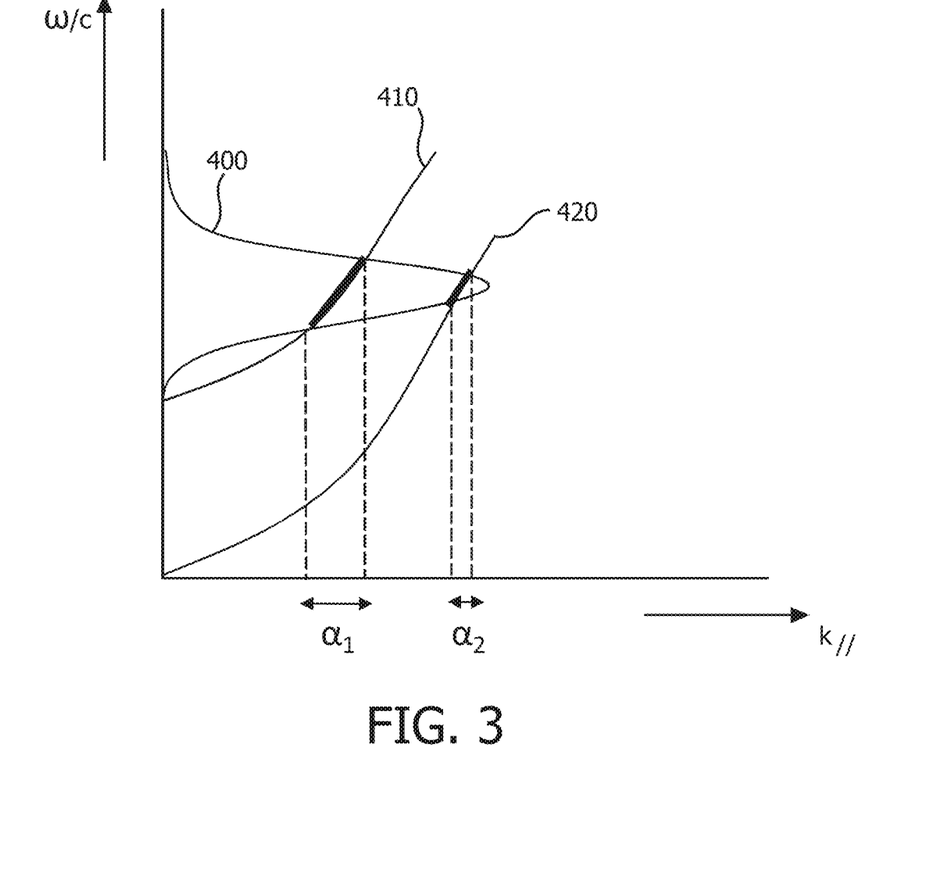
FIG. 3 shows schematically the effect of an adjustment of the antenna array parameters on the emission characteristics of an illumination device.

FIG. 3 qualitatively explains the influence of the design of the antenna array 300 on the emission characteristics of illumination device 100, assuming array 300 is designed to support surface lattice resonances at the secondary wavelength light 122. Depicted is the optical spectrum on the vertical axis versus the appropriate wave vector parallel to the plane of the array. Curve 400 depicts the spectral intensity of the emission spectrum of the wavelength conversion medium 120. Curves 410 and 420 depict the dispersion relation of surface lattice resonances of a first array and a second array, respectively. In general, smaller form factor antennas and lower periodicities of an array shift the corresponding localized surface plasmon resonances and surface lattice resonances, respectively, to the blue part of the spectrum. Also, the resonances of silver antennas are blue shifted relative to gold antennas with the same geometrical characteristics and periodicities. Thus, for instance in the configuration shown, the first array (curve 410) is denser than the second array (curve 420). Optical enhancement occurs where curves 410 and 420 overlap (thick line segments) with the emission spectrum 400 of the phosphor. Due to the smaller overlap of curves 420 and 400, the emission of illumination device 100 may have a more saturated color when applying the second array. Also, advantageously, the light will be emitted at a larger angles α2 relative to the normal of the plane of the array 300, compared to the smaller angles α1 when applying the first array. Assuming the array is positioned normal to the optical axis 200 of the illumination device, these angles correspond to the emission angle α (see FIG. 1). The array, however, does necessarily have to be positioned normal to the optical axis.

In an embodiment, the periodic antenna array 300 is positioned on a side of the wavelength conversion medium 120 facing towards the light source 110. Such a configuration is, for instance, especially beneficial in case the wavelength conversion medium has a thickness which extends beyond the interaction length with the array, i.e. a thickness larger than about the wavelength of the primary and/or secondary light. The wavelength conversion device 120 can then be thought of to comprise of a first part and a second part. The first part, in close proximity with the antenna array 300, will show emission characteristics determined by the interaction with the array (radiation enhancement, modified emission distribution, etc), as described above. The second part will show a "classical" emission characteristic in which the secondary wavelength light is emitted over 4π, i.e. both in the forward and in the backward direction, i.e. towards light source 110. The light emitted in the backward direction may now interact with the array 300 through a surface lattice resonance. Part of this backward directed light may be reflected by the antenna array, thereby enhancing the emission efficiency of the device by reducing the loss of secondary wavelength light 122 in the backward direction.

Figure 4:
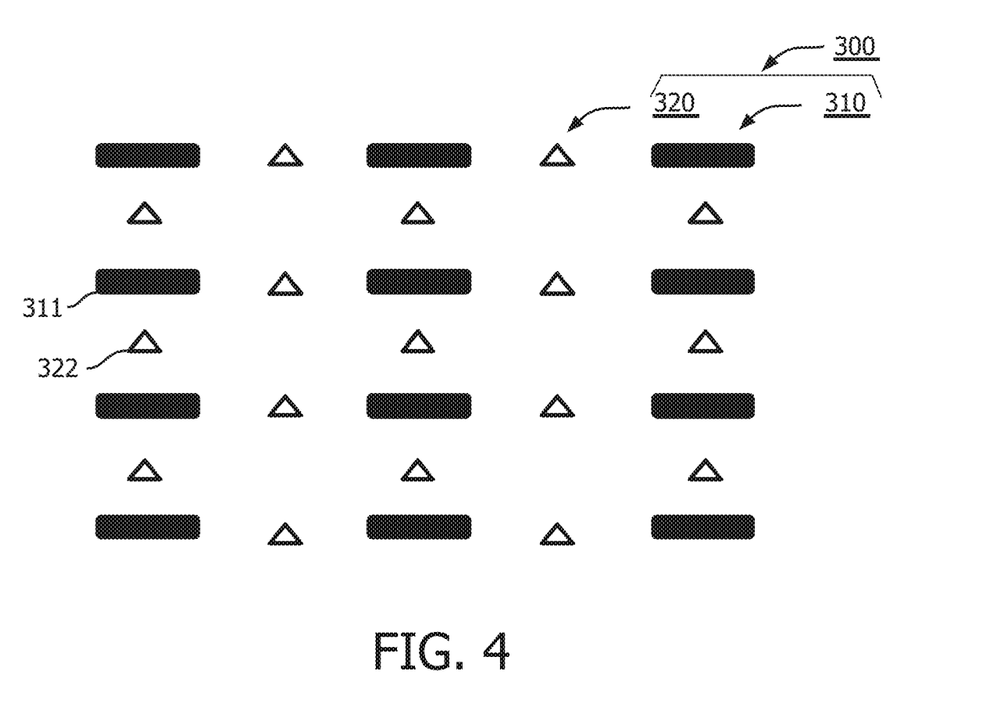
FIG. 4 shows schematically an embodiment of an antenna array.

In an embodiment, the periodic antenna array 300 comprises two interwoven sub-arrays (FIG. 4). The first sub-array 310 comprises first antennas 311, and the second sub-array 320 comprises second antennas 322. Each sub-array may have its own periodicity and the form factor and material composition of the antennas of each sub-array may be chosen appropriately to tune for a desired optical effect. For instance, the first antennas may comprise gold and have a rectangular shape, while the second antennas may comprise silver and have a substantially triangular shape. Alternatively to a triangular shape of an antenna in the plane of the array as depicted in FIG. 4, the triangular shape may be out of plane, as f.i. formed by a pyramid, a ridge, or a tetrahedron shaped antenna. Advantageously, the second sub-array 320 may be designed such that the primary wavelength light 111 excites the localized surface plasmon resonances to enhance the excitation of the wavelength conversion material 120, while the first sub-array 310 may be designed to support surface lattice resonances at the secondary wavelength light 122, i.e. within the emission spectrum of the wavelength conversion medium 120. Alternatively, the wavelength conversion medium 120 may comprise two materials, such as two phosphors or two types of quantum dots, having a first emission wavelength range and a second emission wavelength range, respectively. Periodic antenna array 300 may now be designed such that the first sub-array 310 supports surface lattice resonances arising from diffractive coupling of localized surface plasmon resonances in the individual first antennas 311 at a secondary wavelength 122 within the first emission wavelength range. Moreover, the second sub-array 320 may support surface lattice resonances arising from diffractive coupling of localized surface plasmon resonances in the individual second antennas 322 at a secondary wavelength 122 within the second emission wavelength range. This allows controlling the emission characteristics of the illumination device 100 in both direction and color. The application specific illumination distribution may comprise light with a first color point or color temperature emitted in a first solid angle $\Omega 1$ and a first angle $\alpha 1$ relative to the optical axis 200 of the illumination device 100, and light with a second color point or color temperature emitted in a second solid angle $\Omega 2$ and a second angle $\alpha 2$. As an example, the low or dipped beam of a vehicle may beneficially comprise light with a more yellowish color point towards the middle of the road and light with a more bluish color point towards the road side. Advantageously, such a light distribution will reduce discomfort to upcoming drivers, while simultaneously allows the car driver a better view—since the human eye is more sensitive in the blue part of the visible spectrum under scotopic light conditions—of signs or persons at the road side/pavement.

In an embodiment, the substrate 140 is arranged to be stretchably controllable. As an example, an optically transparent material showing a piezo-electrical effect, such as lithium niobate ($LiNbO_3$) or potassium titanyl phosphate (KTP), may function for forming the substrate 140. The electrically controllable expansion and contraction of such materials allows adjusting the periodicity of the antenna array 300, either in a single (x or y) direction or in both directions. As the optical frequency at which the surface lattice resonance occurs is determined amongst others by the periodicity of the array, this allows active control of the emission efficiency, the directionality of the emission, and the emitted wavelength of illumination device 100. Alternatively, the antenna array 300 may be deposited on a deformable polymer substrate 140, such as a substrate comprising polydimethylsiloxane (PDMS) that can be stretched mechanically to over 30%. The mechanical stretching might be electrically controllable through the use of a microelectromechanical system (MEMS), or might be thermal or humidity induced. In another embodiment, the antenna array 300 may be deposited on a substrate comprising liquid crystalline polymers that deform subject to a phase transition. The latter may be electrically controllable.

Figure 5:
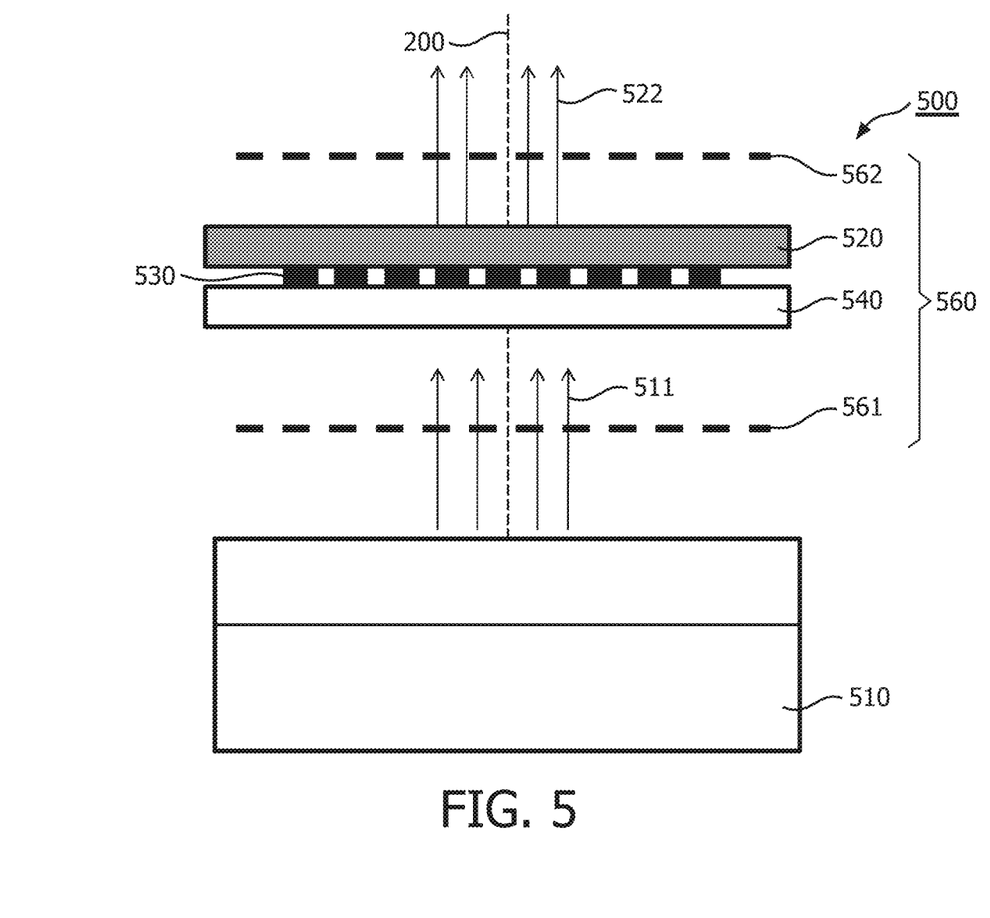
FIG. 5 schematically shows an illumination device in accordance with an embodiment of the invention.

In an embodiment of the invention in accordance with FIG. 5, the illumination device 500 is designed to provide an application specific illumination distribution, and comprises a light source 510 arranged to emit light at a primary wavelength 511, a wavelength conversion medium 520 arranged in light receiving relationship with the light source and designed to convert at least part of the primary wavelength light into secondary wavelength light 522, and a periodic antenna array 530 disposed in close proximity to the wavelength conversion medium and arranged such that the antenna array supports a frequency gap within the emission spectrum of the wavelength conversion medium, for instance at the peak wavelength of the emission spectrum or at a wavelength in the flank of the emission spectrum. In another embodiment, the antenna array 530 supports an electromagnetically induced transparency within the emission spectrum at the secondary wavelength light 522 emitted from the illumination device 500. In yet another embodiment, the antenna array 530 supports both a frequency gap and an electromagnetically induced transparency.

Figure 6A:
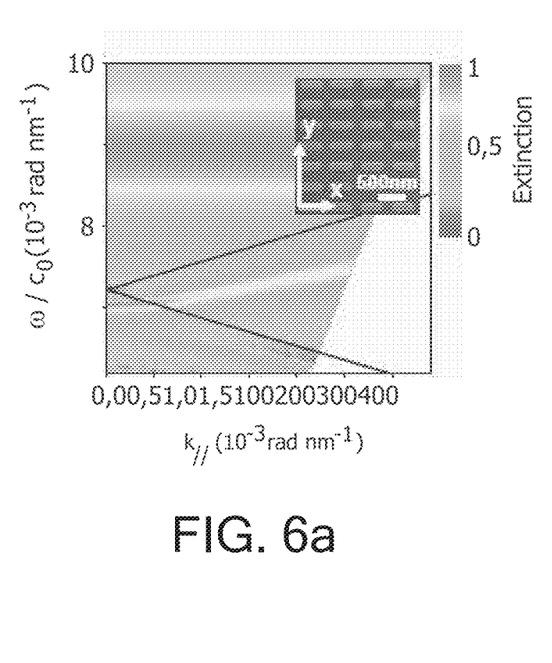
FIG. 6A shows the extinction of light through the antenna array of an embodiment of FIG. 5 as a function of the wave vector parallel to the plane of the array and the light frequency.

FIG. 6A shows the extinction of an 3×3 $mm^2$ array 530 of gold antennas with dimensions 450×120×38 $nm^3$ arranged in a lattice with constants $a_x$=600 nm and $a_y$=300 nm positioned on a glass substrate (see inset SEM image). The extinction spectrum is displayed as a function of the reduced frequency $\omega/c$ and the projection of the incident wave vector onto the plane of the array. The polarization of the light was set along the y-direction, probing the short axis of the antennas. The extinction displays a number of resonances. First of all, the broad and dispersionless peak centered at ~9 mrad/nm corresponds to the excitation of localized surface plasmon resonances. The (±1,0) Rayleigh anomalies are indicated by the up-sloping and down-sloping dark lines. The up- and down-sloping lattice resonances can be observed slightly red-shifted to the Rayleigh anomalies. The origin of the surface lattice resonances is the coupling of localized surface plasmons to the aforementioned Rayleigh anomalies. It can be observed that the lower (−1,0) lattice resonance disappears near $k_\parallel$=0, giving rise to a frequency gap in the dispersion diagram of the antenna array. Advantageously, such a frequency gap allows for forming a distributed feedback laser 500.

Figure 6B:
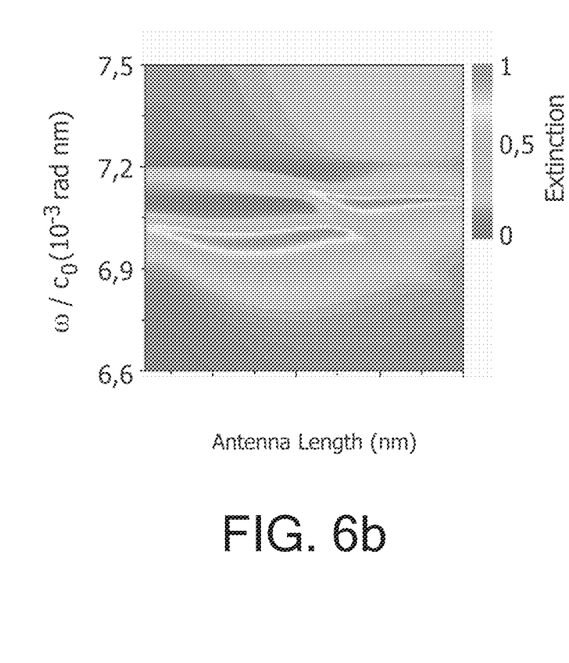
FIG. 6B shows the extinction of light through the antenna array of another embodiment of FIG. 5 as a function of the light frequency and antenna length for light incident at an angle of ~1.2°.

FIG. 6B shows the extinction of the array at a small angle of incidence (~1.2 degrees) as the length of the antenna (in the x direction) decreases while all other parameters (antenna width, height, lattice constants, etc.) are kept constant. The extinction spectrum is limited to the frequencies where the surface lattice resonances, such as described in FIG. 6A, occur for the given angle of incidence. The observed peaks in extinction correspond to the excitation of surface lattice resonances, and the dips in extinction near 7.07 mrad/nm and 7.2 mrad/nm correspond to the (1,0) and (−1,0) Rayleigh anomalies, respectively. The extinction shown in FIG. 6A corresponds to an antenna of length 450 nm; for this length, the (−1,0) surface lattice resonance is not present at such small angles of incidence, i.e. there is a single resonance. As the antenna length decreases, however, the extinction spectrum changes from having a single resonant peak to two resonant peaks, as shown in FIG. 6B. Particularly interesting is the region near 250 nm antenna length, where a dip (the electromagnetically induced transparency region) can be observed between the two peaks. The frequency at which, in this configuration, this dip in extinction occurs is equal to the frequency of the (−1,0) Rayleigh anomaly. The antenna array may, however, be designed such that the electromagnetic induced transparency occurs at other Rayleigh anomalies, such as the (0,−1), the (−1,1), or the (2,1) Rayleigh anomaly.

Thus in an embodiment, the antenna array 530 is arranged such that it supports surface lattice resonances near the secondary wavelength light 522 emitted from the illumination device 500 and a Rayleigh anomaly crosses a surface lattice resonance at a frequency corresponding to the secondary wavelength light. Such a configuration can be arranged by appropriately designing the antenna geometrical form factor (L×W×H) relative to the periodicities of the array.

While the above is described in conjunction with an array displaying an induced transparency near 7 mrad/nm (corresponding to a wavelength of ~888 nm), appropriate adjustment of the array parameters allows designing the transparency anywhere in the visible spectrum. For instance, an array of silver antennas with dimensions 250×70×20 nm³ configured in a rectangular lattice with constants $a_x$=350 nm and $a_y$=200 nm, will yield a localized plasmon resonance for the short axis of the antennas at λ=483 nm, and results in a surface lattice resonance near λ=587 nm. Moreover, reducing the width of the antennas from 70 nm to 40 nm will shift the localized plasmon resonance further into the blue; while reducing the lattice constant $a_x$=350 nm to say $a_x$=250 nm, blue-shifts the surface lattice resonances to near 450 nm.

Beneficially the electromagnetically induced transparency allows fabricating a distributed feedback surface polariton lighting device 500, such as depicted in FIG. 5. Such a device may further comprise an optional cavity 560 embedding or straddling the wavelength conversion medium 520 and the antenna array 530. The cavity 560 is formed by mirrors 561 and 562. Mirror 561 is transparent to the primary wavelength light 511 while being reflective for the secondary wavelength light 522. Mirror 562 is at least partially reflective for the secondary wavelength light. Advantageously, the emission of the wavelength conversion medium 520 in close proximity of the antenna array 530 will be enhanced, since the coupling to the resonant antennas increases the decay rate for the emitters in the wavelength conversion medium. Despite this emission enhancement, the antenna array 530 remains transparent to far field extinction at the emission frequency of the wavelength conversion medium 520 due to the electromagnetically induced transparency. The possibility of simultaneous emission enhancement and far-field transparency arises from the different near-field and far-field behavior of the antenna array 530. Thus, this allows the lighting device 500 to function not only as a (super-fluorescent) LED, but also as a laser. Alternatively, a distributed feedback laser may also be created with an antenna array 530 having a dispersion such as that shown in FIG. 6A, i.e. without an electromagnetically induced transparency. In such a device, lasing is possible at the band edges, i.e. near the frequency gap where the two surface lattice resonances approach each other in frequency. The main advantage of having an electromagnetically induced transparency at the secondary wavelength resides in the possibility of embedding the antenna array 530 in a cavity 560 such as depicted in FIG. 5, while having simultaneous resonant enhancement of the emission and negligible losses of the feedback light within the cavity. It is important to realize that without this induced transparency, any secondary wavelength light that is being recycled within the cavity is likely to be absorbed or scattered by the antenna array 530, since the antennas are resonant at the secondary wavelength 522.

Figure 7A:
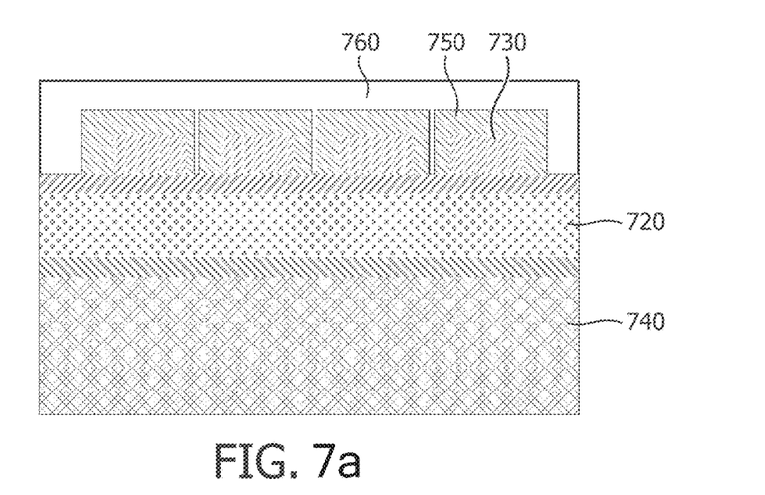
FIG. 7A schematically shows part of an illumination device exhibiting a waveguide structure in accordance with an embodiment of the invention.

In yet another embodiment, the illumination device comprises a waveguide structure as depicted in FIG. 7A positioned in light receiving relationship with its light source. The waveguide structure comprises a wavelength converting medium 720 arranged in close proximity of an antenna array 730 and clad by a transparent substrate 740 and a transparent medium 760. Transparent substrate 740 (f.i. SiO₂–n=1.46) and transparent medium 760 (f.i. air–n=1) have an index of refraction lower than the index of refraction of the wavelength converting medium 720 (f.i. YAG:Ce–n=1.7) to induce guided modes for light in the latter. The antenna array 730 is immersed in a coating 750 (such as Si₃N₄–n=2.0) arranged to enhance the optical uniformity of the environment surrounding the array, allowing a more efficient coupling of primary and/or secondary wavelength light the waveguide modes in the wavelength converting medium 720 with the localized surface plasmon resonances at the antenna's and the surface lattice resonances in the antenna array 730. A strong coupling between the localized surface plasmon resonances and the waveguide modes leads to a polaritonic hybrid mode that is characterized by relative long life times and large quality factors, thus allowing enhancing and tailoring the light emitted by the illumination device.

The antenna array 730 in the waveguide structure allows for coupling the far field incident primary light of the illumination device's light source into the guided modes of the waveguide 720, which are otherwise inaccessible by far-field illumination due to momentum mismatch. The wavelength converting medium 720 typically has a thickness between 50 nm-5 μm, more preferably between 100 nm-1 μm, even more preferably between 200 nm-800 nm. The coating 750 surrounding the antennas has a thickness between 5 nm-50 nm, preferably between 10 nm-40 nm, such as 20 nm. It may be applied by first depositing a layer of f.i. Si₃N₄ on the wavelength converting medium 720, followed by positioning the antenna array using substrate conformal imprint lithography, and finished off by a second layer of f.i. Si₃N₄ encapsulating the antennas through plasma enhanced chemical vapor deposition. As an additional advantage the coating 750 protects the antenna array against the detrimental consequences of oxidation.

Figure 7B:
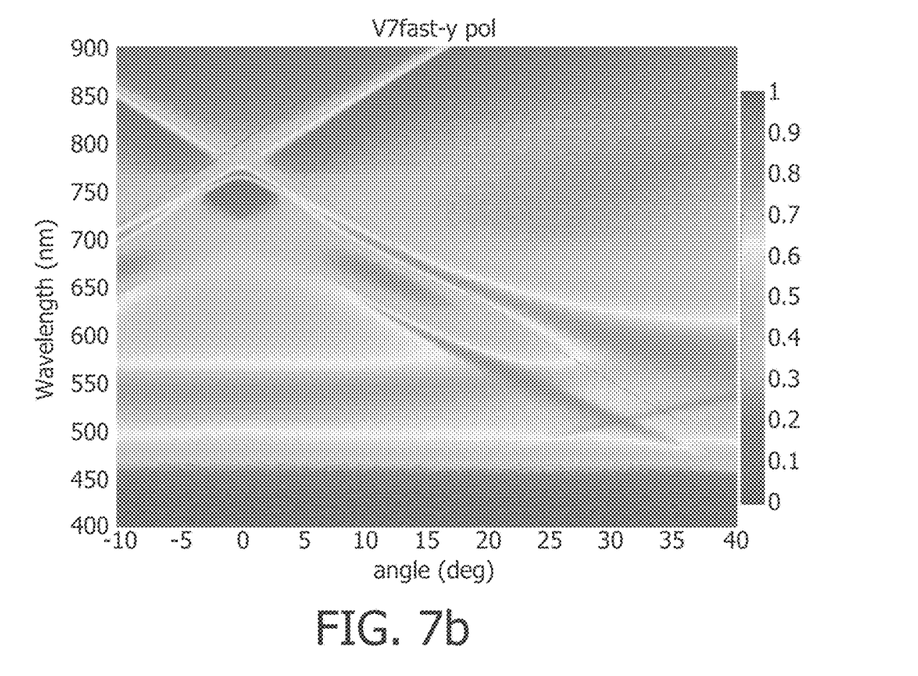
FIG. 7B shows the extinction of light through the waveguide structure of FIG. 7A.

FIG. 7B shows the extinction of light through the waveguide structure of FIG. 7A. One can observe three distinct features. First of all, independent of the angle of incidence, between about 500-550 nm the localized surface plasmon resonances at the individual antennas can be identified. Furthermore, two resonance structures can be identified. The first at about 760 nm for a 0° angle of incidence can be attributed to the Rayleigh anomalies and surface lattice resonances described above in conjunction with FIGS. 5&6. The second resonance structure at about 700 nm for a 0° angle of incidence can be associated with the polaritonic hybrid modes of the strongly coupled waveguide modes and the localized surface plasmon resonances. The spectral and angular position of the resonance structures, both in extinction and in emission (not shown) may be tuned in dependence of the size, shape, and material of the antennas, the periodicity of the antenna array, the presence and thickness of the waveguide and coating, and the refractive index of the transparent substrate 740 and medium 760. This allows a versatile design of the application specific illumination distribution provided by the illumination device. For instance, omitting the coating 750 around the antennas 730 induces too large optical inhomogeneities for the surface lattice resonances to occur. Alternatively, increasing the index of refraction of substrate 740 and material 760 to the index of refraction of the wavelength converting material 720 or above will prevent the waveguide modes to occur.

Thus, proposed is an illumination device designed to provide an application specific illumination distribution, comprising: (i) a light source arranged to emit light at a primary wavelength, (ii) a waveguide structure comprising a wavelength conversion medium arranged in light receiving relationship with the light source and designed to convert at least part of the primary wavelength light into secondary wavelength light, and a periodic antenna array disposed in close proximity to the wavelength conversion medium and arranged such that the antenna array supports coupling of localized surface plasmon resonances in individual antennas with the wave guide modes for enabling the application specific illumination distribution. In an embodiment the antenna array is encapsulated with a coating for increasing the optical homogeneity of the antenna environment for supporting surface lattice resonances arising from diffractive coupling of localized surface plasmon resonances in individual antennas.

Although the invention has been elucidated with reference to the embodiments described above, it will be evident that alternative embodiments may be used to achieve the same objective. The scope of the invention is therefore not limited to the embodiments described above. Accordingly, the spirit and scope of the invention is to be limited only by the claims and their equivalents.

The invention claimed is:

1. A structure comprising:
   a semiconductor light emitting device for emitting a first light at a first wavelength;
   a wavelength conversion medium arranged to convert at least part of the first light into a second light at a second wavelength; and
   a periodic antenna array comprising a plurality of antennas, wherein the periodic antenna array supports surface lattice resonances arising from diffractive coupling of localized surface plasmon resonances in at least one of the antennas;
   wherein a distance between the wavelength conversion medium and the periodic antenna array is smaller than the wavelength of the first light or the second light.

2. The structure of claim 1 wherein the periodic antenna array supports surface lattice resonances at least at one of the first wavelength and the second wavelength.

3. The structure of claim 1 wherein the distance is smaller than 700 nm.

4. The structure of claim 1 wherein the distance is smaller than 300 nm.

5. The structure of claim 1 wherein the periodicity of the periodic antenna array is of the order of the first wavelength or the second wavelength.

6. The structure of claim 1 wherein the antennas comprise a material selected from the group consisting of a noble metal, gold, silver, copper, platinum, palladium, nickel, aluminum, and an alloy.

7. The structure of claim 6 wherein the antennas comprise a chromium adhesive.

8. The structure of claim 1 wherein the periodic antenna array is disposed on a transparent substrate.

9. The structure of claim 8 wherein the transparent substrate is conformed for mechanical stretching, wherein the mechanical stretching may be thermally induced, humidity induced, or electrically induced.

10. The structure of claim 8 wherein the transparent substrate is conformed for mechanical stretching, wherein the mechanical stretching may be controlled by a microelectromechanical system or a liquid crystal polymer that deforms due to a phase transition.

11. The structure of claim 8 wherein the transparent substrate comprises a material showing a piezo-electrical effect.

12. The structure of claim 11 wherein the material showing piezo-electrical effect is selected from the group consisting of $LiNbO_3$ and potassium titanyl phosphate.

13. The structure of claim 8 wherein the transparent substrate comprises a deformable polymer.

* * * * *